United States Patent [19]

Clutterbuck et al.

[11] Patent Number: 4,604,536

[45] Date of Patent: Aug. 5, 1986

[54] TIMING CIRCUITS

[75] Inventors: Richard C. D. Clutterbuck, Cobham; Anthony R. Painton, Slough, both of England

[73] Assignee: EMI Limited, Hayes, England

[21] Appl. No.: 587,537

[22] Filed: Mar. 8, 1984

[30] Foreign Application Priority Data

Mar. 9, 1983 [GB] United Kingdom ................ 8306483

[51] Int. Cl.[4] ...................... H03K 17/28; H03K 21/02

[52] U.S. Cl. .................................... 307/603; 307/608; 377/107; 377/110; 377/111; 328/130.1

[58] Field of Search ............... 307/269, 271, 603, 608, 307/595, 597; 377/108, 111, 110, 107; 328/129.1, 130.1

[56] References Cited

U.S. PATENT DOCUMENTS

| | | | |
|---|---|---|---|
| 3,906,374 | 9/1975 | Fletcher et al. | 377/111 |
| 4,041,403 | 8/1977 | Chiapparoli | 377/111 |
| 4,092,604 | 5/1978 | Berney | 307/271 |

*Primary Examiner*—John S. Heyman

*Attorney, Agent, or Firm*—Fleit, Jacobson, Cohn & Price

[57] ABSTRACT

A clock circuit is initiated by an external trigger pulse. Timing measurements commence at a first rate, and after a first delay ($t_1$) which is sufficient to allow an oscillator of the clock circuit to stabilize. After a second delay ($t_1$) the clock circuit operates at a second rate which is half the first rate. The clock circuit then represents the time from reception of the external trigger pulse. The first and second delays are derived by charging a capacitor at a constant rate and comparing the voltage level developed across it with respective reference voltages ($V_1$, $V_2$) in comparators.

In general, the second rate may be $1/r+1$ times the first rate, where r is the ratio of the first delay to the second delay.

6 Claims, 3 Drawing Figures

TIMING CIRCUITS

This invention relates to a timing circuit.

In some timing applications it may be necessary to commence timing measurements when an external pulse is received by a clock circuit; however, this can prove difficult if the external pulse is used also to initiate supply of power to the clock circuit. This may occur, for example, in the case of a clock circuit including an oscillator which usually requires an initial period of stabilisation before reliable clock pulses can be derived.

It is an object of this invention to provide a timing circuit whereby the above-described problem is substantially alleviated.

Accordingly there is provided a timing circuit comprising a clock circuit and a control circuit, the control circuit being arranged to receive an external pulse and to generate in response thereto, and after a first delay, a first control pulse suitable for causing the clock circuit to commence operation at a first rate and being arranged to generate, after a further delay, a second control pulse suitable for causing the clock circuit to operate at a second rate $1/(r+1)$ times the first rate, where r is the ratio of the first delay to the further delay, whereby after said further delay the clock circuit provides a representation of elapsed time from occurrence of the external pulse. The ratio r may be in the range 0.1 to 2.0 and values of 1, 3, 7 and 15 may be especially useful.

In a preferred embodiment the control circuit comprises a voltage source for generating in response to said external pulse a voltage which increases linearly with time, and respective comparison means for generating said first and second control pulses when the voltage generated by the voltage source attains first and second reference levels.

Conveniently, said voltage source may comprise a constant current source arranged to charge a capacitor in response to said external pulse and means for amplifying a voltage developed across the capacitor. One input of each said comparison means may be connected electrically to said voltage source and the other input is connected electrically to a respective reference voltage.

Figure 1A:
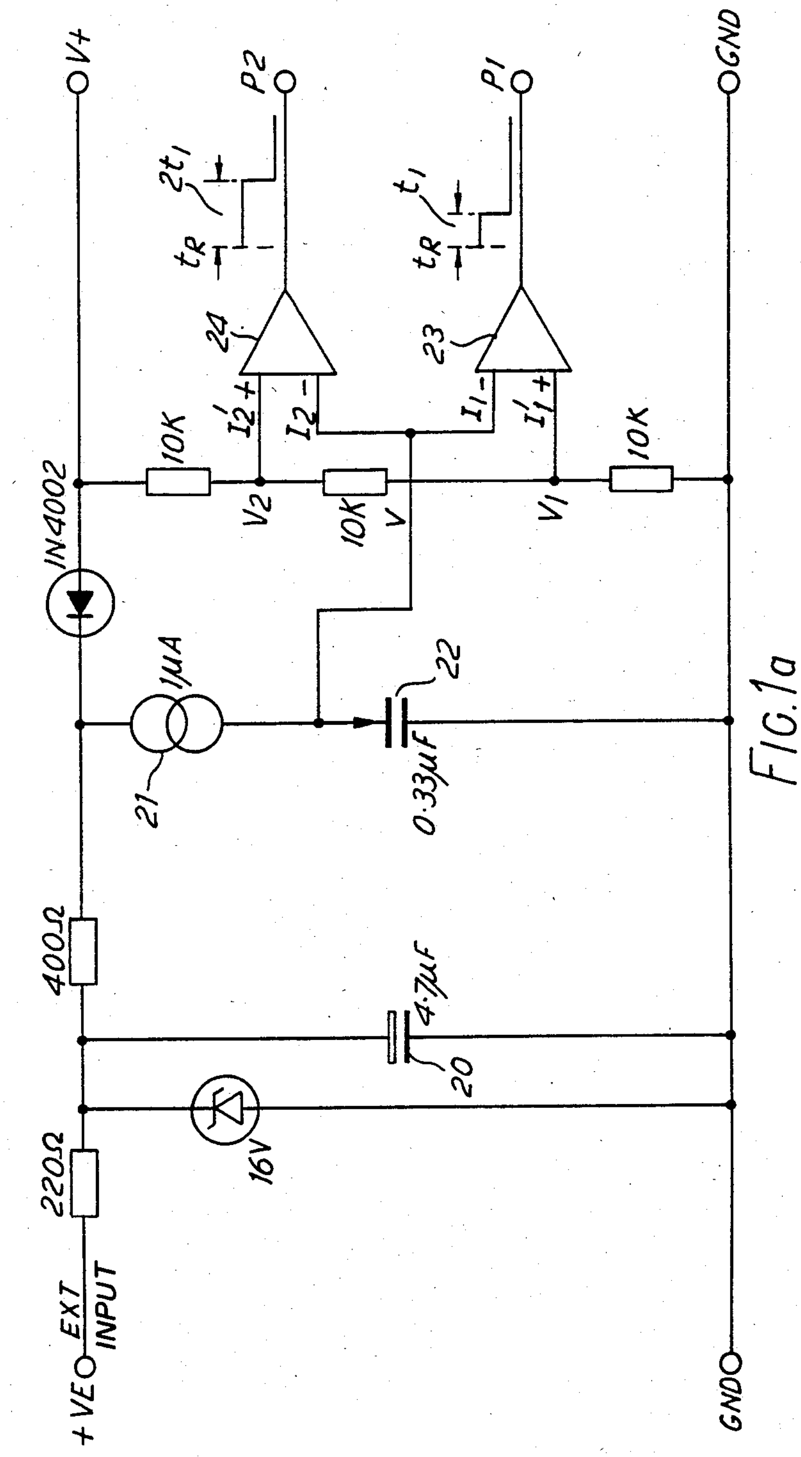
Figure 1B:
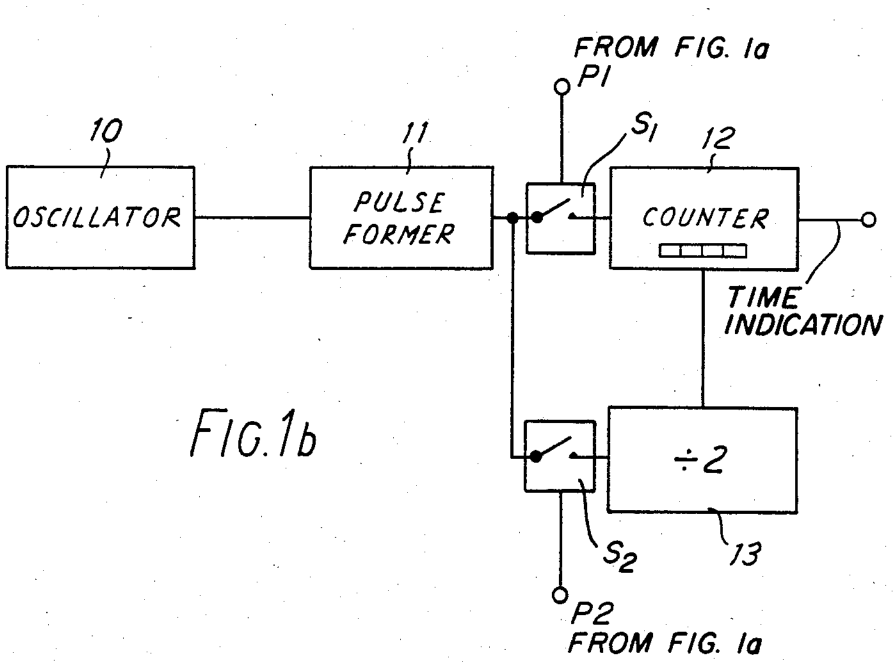
Figure 2:
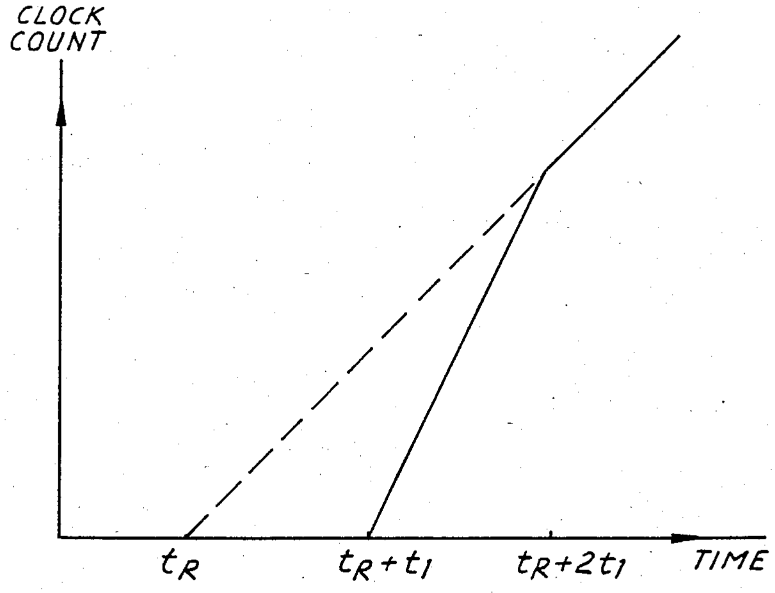

A particular embodiment of the invention is now described by way of example only by reference to the Figures of the accompanying drawings of which:

FIG. 1*a* shows a control circuit forming part of a timing circuit,

FIG. 1*b* shows a clock circuit used in conjunction with the control circuit of FIG. 1*a*, and FIG. 2 represents the clock count as a function of time generated by the timing circuit of FIGS. 1.

FIG. 1*a* shows a control circuit which can be used in conjunction with a clock circuit, shown schematically (by way of example only) in FIG. 1*b*. The clock circuit has an oscillator 10 the output of which is connected to a pulse forming circuit 11. As described hereinbefore, the oscillator may require a significant time interval after power has been applied to reach a stable condition suitable for generating reliable clock pulses. If switch S1 in FIG. 1*b* is closed (and S2 is open) pulses formed at 11 are counted directly at 12; however, if switch S2 is closed (and S1 is open) the pulses pass first through a divide-by-two circuit 13 thus halving the count rate.

The control circuit of FIG. 1*a* is arranged to generate control pulses which actuate switches S1 and S2 at appropriate times to control the operating rate of the clock circuit and, as will be described in greater detail, it is possible to derive reliable timing measurements, representing elapsed time from occurrence of an external pulse, even though operation of the clock circuit itself commences some time later, after a delay sufficient to allow the oscillator to stabilise.

Referring to FIG. 1*a* an external pulse EXT received by the control circuit charges a capacitor 20 connected across a constant current source 21. The external pulse is received at a time $t_R$ in FIG. 2. The constant current source then charges a second capacitor 22 at a constant rate so that the voltage developed across it increases linearly with time. This voltage is applied to respective input terminals $I_1$, $I_2$ of a pair of comparators 23, 24. The other input terminals $I_1'$ $I_2'$ of the comparators are connected to respective reference voltages $V_1$, $V_2$ with which the amplified voltage is compared. Voltage level $V_1$ is set at a value developed across capacitor 22 after a first delay $t_1$ (i.e. at time $t_R+t_1$) sufficient to allow the oscillator in the clock circuit to stabilised. Comparator 23 then generates a control pulse $P_1$ which is used to close switch S1 and open switch S2 in the clock circuit which then operates at the relatively fast rate. Voltage level $V_2$, on the other hand, is set at a value developed across capacitor 22 after a further delay $t_1$ (i.e. at time $t_R+2t_1$) and comparator 24 then generates a second control pulse $P_2$ which opens switch S1 and closes switch S2 in the clock circuit which then operates at the slower rate.

The broken line in FIG. 2 represents the clock count which would have been attained if the clock circuit had started operating at time $t_R$ at the slow rate. In practice, operation was delayed by a time period $t_1$ to allow the oscillator to stabilise; however, by operating the clock circuit at twice the slow rate for a further time period $t_1$ the count deficiency is compensated fully and thereafter the count represents accurately the elapsed time from occurrence at time $t_R$ of the external pulse in units of time corresponding to a clock operating at the relatively slow rate.

In the above dascribed example the time delays $t_1$ were of equal duration but this need not necessarily be the case.

In general, if the ratio of the first time delay to the further time delay is r the clock circuit would need to operate at a slow rate $1/(r+1)$ times the fast rate, and preferably r may be from 0.1 to 2.0. Values of 1, 3, 7 and 15 may be especially useful.

We claim:

1. A timing circuit comprising, a control circuit including a first pulse generating means for generating a first control pulse on expiry of a first delay, of preset duration, measured from reception of an external pulse, and a second pulse generating means for generating a second control pulse on expiry of a second delay, of preset duration, measured from the end of said first delay; and a clock circuit including means for generating clock pulses and counting means, responsive to said first and second control pulses, to count said clock pulses respectively at a first rate and a second rate, $1/(r+1)$ times the first rate, where r is the ratio of said first delay to said second delay, whereby after said second delay the count produced by said counting circuit represents the elapsed time as measured from reception of said external pulse.

2. A timing circuit according to claim 1 wherein said control circuit comprises a voltage source for generating a linearly increasing voltage in response to said external pulse, and wherein said first and second pulse generating means comprises respective comparison means for generating said first and second control pulses when the voltage generated by said voltage source respectively attains first and second reference levels.

3. A timing circuit according to claim 2 wherein said voltage source comprises a constant current source arranged to charge a capacitor in response to said external pulse.

4. A timing circuit according to claim 3 wherein one input of each said comparison means is connected electrically to sense the voltage across said capacitor and the other input is connected electrically to a respective reference voltage.

5. A timing circuit according to claim 1 wherein r has a value in the range 0.1 to 2.0.

6. A timing circuit according to claim 2 wherein r has the value 1, 3, 7 or 15.

* * * * *